(12) United States Patent
Hiyoshi et al.

(10) Patent No.: US 9,178,021 B1
(45) Date of Patent: Nov. 3, 2015

(54) SILICON CARBIDE SEMICONDUCTOR DEVICE

(71) Applicant: Sumitomo Electric Industries, Ltd., Osaka-shi (JP)

(72) Inventors: Toru Hiyoshi, Osaka (JP); Kosuke Uchida, Osaka (JP); Takashi Tsuno, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/638,497

(22) Filed: Mar. 4, 2015

(30) Foreign Application Priority Data

Apr. 15, 2014 (JP) .................................. 2014-083567

(51) Int. Cl.
| | | |
|---|---|---|
| *H01L 29/15* | (2006.01) | |
| *H01L 29/16* | (2006.01) | |
| *H01L 29/78* | (2006.01) | |
| *H01L 29/36* | (2006.01) | |
| *H01L 29/10* | (2006.01) | |

(52) U.S. Cl.
CPC ........ *H01L 29/1608* (2013.01); *H01L 29/1095* (2013.01); *H01L 29/36* (2013.01); *H01L 29/7813* (2013.01)

(58) Field of Classification Search
CPC . H01L 29/76; H01L 29/1608; H01L 29/7813; H01L 29/36; H01L 29/1095
USPC ..................................... 257/77, 338, E29.262
See application file for complete search history.

(56) References Cited

U.S. PATENT DOCUMENTS

2014/0145212 A1   5/2014   Takeuchi et al.

FOREIGN PATENT DOCUMENTS

| JP | 2010-225615 A | 10/2010 |
|---|---|---|
| JP | 2013-038308 A | 2/2013 |

*Primary Examiner* — Tan N Tran
(74) *Attorney, Agent, or Firm* — Venable LLP; Michael A. Sartori

(57) ABSTRACT

A silicon carbide semiconductor device includes a silicon carbide layer, a body region, a source region, a gate insulating film, a gate electrode, a source electrode, a first impurity region, and a second impurity region. The second impurity region is disposed within the silicon carbide layer so as to connect the body region and the first impurity region to each other, and has a second conductivity type. An impurity concentration in the second impurity region is equal to or higher than an impurity concentration in the silicon carbide layer and equal to or lower than a lower limit of an impurity concentration in the body region.

8 Claims, 9 Drawing Sheets

SILICON CARBIDE SEMICONDUCTOR DEVICE

BACKGROUND OF THE INVENTION

1. Field of the Invention

The present invention relates to silicon carbide semiconductor devices.

2. Description of the Background Art

Conventionally, silicon has been widely used as a material for a semiconductor device. In recent years, silicon carbide has been increasingly employed as a material for a semiconductor device. Silicon carbide is a wide band gap semiconductor having a band gap wider than that of silicon. By employing silicon carbide as a material for a semiconductor device, a higher breakdown voltage and loss reduction of the semiconductor device can be achieved, and the semiconductor device can be used in a high-temperature environment.

In order to attain a higher breakdown voltage of a semiconductor device, the structure of a semiconductor device has been studied in addition to the material of a semiconductor device. As an example, a silicon carbide semiconductor device having an outer peripheral structure surrounding an outer periphery of a transistor cell region has been proposed. For example, Japanese Patent Laying-Open No. 2013-38308 discloses a silicon carbide semiconductor device including a transistor cell region and an outer voltage-breakdown-resistant structure that surrounds an outer periphery of the transistor cell region. The outer voltage-breakdown-resistant structure includes a P type RESURF (Reduced Surface Field) layer. The P type RESURF layer includes a first P type region formed at the bottom of a first recess, a second P type region formed at the bottom of a second recess, and a P+ type layer connecting the first P type region and the second P type region to each other. The first recess is formed deeper than the second recess. The first P type region is provided on the P+ type layer forming a gate region of a transistor cell.

Japanese Patent Laying-Open No. 2010-225615 discloses a silicon carbide semiconductor device having a mesa structure portion formed in an outer peripheral region. The mesa structure portion includes a recess. A P type RESURF layer is formed at the bottom of the recess. The P type RESURF layer is connected to a P+ type contact layer. The P+ type contact layer is provided in a P type region forming a base region of a transistor.

SUMMARY OF THE INVENTION

A silicon carbide semiconductor device may be damaged depending on its operating conditions. Accordingly, not only the breakdown voltage but also the ruggedness of a silicon carbide semiconductor device needs to be studied.

When a high voltage is applied to the silicon carbide semiconductor devices described in the aforementioned documents, for example, avalanche breakdown may occur in the outer peripheral structure. The outer peripheral structure includes a P+ type region electrically connected to a body region (referred to as a gate region or base region in the aforementioned documents) of the transistor. This P+ type region is provided so as to reduce a voltage difference between the outer peripheral structure and the body region of the transistor.

When avalanche breakdown occurs, however, the voltage of the outer peripheral structure increases. As the voltage of the outer peripheral structure increases, the voltage of the body region of the transistor increases. The voltage difference between the outer peripheral structure and the body region of the transistor is small due to the P+ type region. Meanwhile, the voltage of a gate electrode remains low (e.g., 0 V). Thus, a voltage difference between the body region and the gate electrode increases. The increased voltage difference between the body region and the gate electrode may cause breakdown of a gate insulating film, for example. Accordingly, there may be a need to improve the ruggedness of a silicon carbide semiconductor device having a conventional structure.

An object of the present invention is to provide a silicon carbide semiconductor device capable of achieving increased ruggedness.

A silicon carbide semiconductor device according to one embodiment of the present invention includes a silicon carbide layer, a body region, a source region, a gate insulating film, a gate electrode, a source electrode, a first impurity region, and a second impurity region. The silicon carbide layer includes a first main surface and a second main surface located opposite to the first main surface, and has a first conductivity type. The body region is disposed within the silicon carbide layer, and has a second conductivity type different from the first conductivity type. The source region is disposed within the body region so as to be in contact with the first main surface of the silicon carbide layer, and has the first conductivity type. The gate insulating film is disposed so as to cover a surface of at least a portion of the body region which lies between the source region and the silicon carbide layer. The gate electrode is in contact with the gate insulating film. The source electrode is disposed so as to be electrically connected to the body region and the source region. The first impurity region is disposed within the silicon carbide layer and away from the body region, across the body region from the gate electrode in a direction along the first main surface of the silicon carbide layer, and has the second conductivity type. The second impurity region is disposed within the silicon carbide layer so as to connect the body region and the first impurity region to each other, and has the second conductivity type. An impurity concentration in the second impurity region is equal to or higher than an impurity concentration in the silicon carbide layer and equal to or lower than a lower limit of an impurity concentration in the body region.

According to the above, the silicon carbide semiconductor device having increased ruggedness can be realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Description of Embodiments of the Invention

Figure 1:
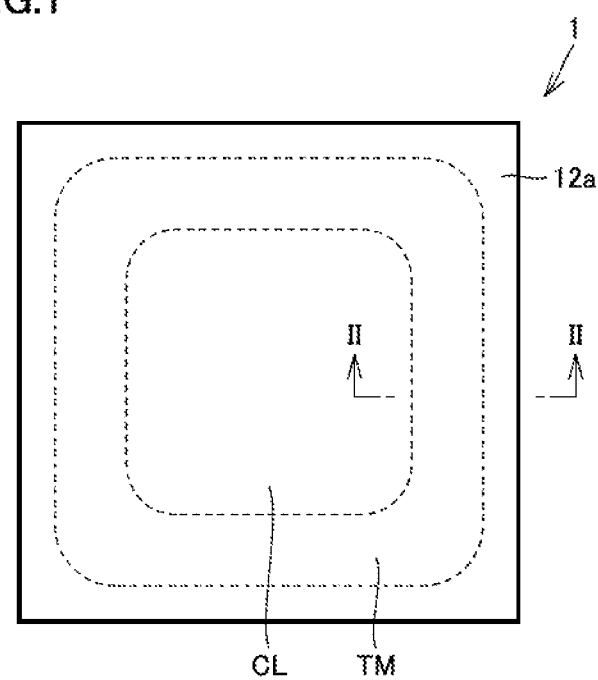
FIG. 1 is a schematic plan view of a silicon carbide semiconductor device 1 according to a first embodiment of the present invention.

Embodiments of the present invention will be described below with reference to the drawings. In the following description, the same or corresponding elements have the same characters allotted and detailed description thereof will not be repeated.

Regarding crystallographic denotation herein, an individual orientation, a group orientation, an individual plane, and a group plane are shown in [ ], < >, ( ), and { }, respectively. Although a crystallographically negative index is normally expressed by a number with a bar "-" thereabove, a negative sign herein precedes a number to indicate a crystallographically negative index. Further, angles are described using a system having an omni-directional angle of 360 degrees.

First, the embodiments of the present invention will be described in list form.

(1) A silicon carbide semiconductor device (1, 2, 3, 4) according to one embodiment of the present invention includes a silicon carbide layer (12), a body region (13), a source region (14), a gate insulating film (15a), a gate electrode (27), a source electrode (16), a first impurity region (21), and a second impurity region (23). The silicon carbide layer (12) includes a first main surface (12a) and a second main surface (12b) located opposite to the first main surface (12a), and has a first conductivity type. The body region (13) is disposed within the silicon carbide layer (12), and has a second conductivity type different from the first conductivity type. The source region (14) is disposed within the body region (13) so as to be in contact with the first main surface (12a) of the silicon carbide layer (12), and has the first conductivity type. The gate insulating film (15a) is disposed so as to cover a surface of at least a portion (CH) of the body region (13) which lies between the source region (14) and the silicon carbide layer (12). The gate electrode (27) is in contact with the gate insulating film (15a). The source electrode (16) is disposed so as to be electrically connected to the body region (13) and the source region (14). The first impurity region (21) is disposed within the silicon carbide layer (12) and away from the body region (13), across the body region (13) from the gate electrode (27) in a direction (X) along the first main surface (12a) of the silicon carbide layer (12), and has the second conductivity type. The second impurity region (23) is disposed within the silicon carbide layer (12) so as to connect the body region (13) and the first impurity region (21) to each other, and has the second conductivity type. An impurity concentration in the second impurity region (23) is equal to or higher than an impurity concentration in the silicon carbide layer (12) and equal to or lower than a lower limit of an impurity concentration in the body region (13).

According to the above configuration, the silicon carbide semiconductor device having increased ruggedness can be realized. The first impurity region (21) can function as an outer peripheral structure for increasing the breakdown voltage of the silicon carbide semiconductor device (1, 2, 3, 4). When avalanche breakdown occurs between the first impurity region (21) and the silicon carbide layer (12), the voltage of the first impurity region (21) increases. Since the impurity concentration in the second impurity region (23) is equal to or lower than the lower limit of the impurity concentration in the body region (13), the second impurity region (23) has a high electrical resistance value. A large voltage drop can be generated in the second impurity region (23), and therefore a voltage difference between the body region (13) and the gate electrode (27) can be reduced. Consequently, when avalanche breakdown occurs between the first impurity region (21) and the silicon carbide layer (12), an electric field applied to the gate insulating film (15a) can be reduced. Accordingly, the ruggedness of the silicon carbide semiconductor device (1, 2, 3, 4) can be increased.

(2) Preferably, the impurity concentration in the second impurity region (23) is lower than the lower limit of the impurity concentration in the body region (13).

According to the above configuration, the electrical resistance value of the second impurity region (23) can be further increased. A large voltage drop can be generated in the second impurity region (23), and therefore the voltage difference between the body region (13) and the gate electrode (27) can be reduced. Consequently, when avalanche breakdown occurs between the first impurity region (21) and the silicon carbide layer (12), the electric field applied to the gate insulating film (15a) can be further reduced. Accordingly, the ruggedness of the silicon carbide semiconductor device (1, 2, 3, 4) can be further increased.

(3) Preferably, the impurity concentration in the second impurity region (23) is not less than $1 \times 10^{14}$ cm$^{-3}$ and less than $5 \times 10^{17}$ cm$^{-3}$.

According to the above configuration, when avalanche breakdown occurs between the first impurity region (21) and the silicon carbide layer (12), the electrical resistance value can be set appropriately so as to generate a sufficient voltage drop in the second impurity region (23).

(4) Preferably, the impurity concentration in the second impurity region (23) is not less than $1 \times 10^{16}$ cm$^{-3}$ and less than $5 \times 10^{17}$ cm$^{-3}$.

According to the above configuration, when avalanche breakdown occurs between the first impurity region (21) and the silicon carbide layer (12), the electrical resistance value can be set appropriately so as to generate a sufficient voltage drop in the second impurity region (23). Moreover, by further raising the lower limit of the impurity concentration in the second impurity region (23), a voltage difference between the body region (13) and the first impurity region (21) can be made small until avalanche breakdown occurs between the first impurity region (21) and the silicon carbide layer (12). Accordingly, the breakdown voltage of the silicon carbide semiconductor device can be increased.

(5) Preferably, the length (L) of the second impurity region (23) along the first main surface (12a) of the silicon carbide layer (12) from the body region (13) to the first impurity region (21) is equal to or greater than ⅓ of the thickness (Depi) of the silicon carbide layer (12).

According to the above configuration, when avalanche breakdown occurs between the first impurity region (21) and the silicon carbide layer (12), a sufficient voltage drop can be generated in the second impurity region (23).

(6) Preferably, the first main surface (12a) of the silicon carbide layer (12) is provided with a trench (TR). The trench (TR) includes a side portion (SW) extending through the source region (14) and the body region (13) to reach the silicon carbide layer (12). The gate insulating film (15a) is in contact with the side portion (SW) of the trench (TR). The gate electrode (27) is in contact with the gate insulating film (15a) within the trench (TR).

According to the above configuration, the silicon carbide semiconductor device having an increased density of elements (cells) can be realized. Accordingly, the on-resistance of the silicon carbide semiconductor device can be reduced.

(7) Preferably, the first main surface (12a) of the silicon carbide layer (12) includes a first surface (121) in contact with the source region (14), a second surface (122) connected to the first surface (121) and inclined with respect to the first surface (121) so as to extend toward the second main surface (12b) of the silicon carbide layer (12), and a third surface (123) connected to the second surface (122) and being in contact with the first impurity region (21).

According to the above configuration, the breakdown voltage of the silicon carbide semiconductor device can be increased.

(8) Preferably, the first conductivity type is n type, and the second conductivity type is p type.

According to the above configuration, the manufacturability of the silicon carbide semiconductor device can be improved.

Details of Embodiments of the Invention

First Embodiment

FIG. 1 is a schematic plan view of a silicon carbide semiconductor device 1 according to a first embodiment of the present invention. Referring to FIG. 1, silicon carbide semiconductor device 1 according to the first embodiment of the present invention includes an element region CL and a termination region TM. Element region CL includes a plurality of MOSFET (Metal Oxide Semiconductor Field Effect Transistor) cells (see FIG. 2). Termination region TM is provided on the outer side of element region CL to surround element region CL. In FIG. 1, a first main surface 12a of a drift layer 12 (see FIG. 2) is shown so as to facilitate understanding of the arrangement of element region CL and termination region TM.

Figure 2:
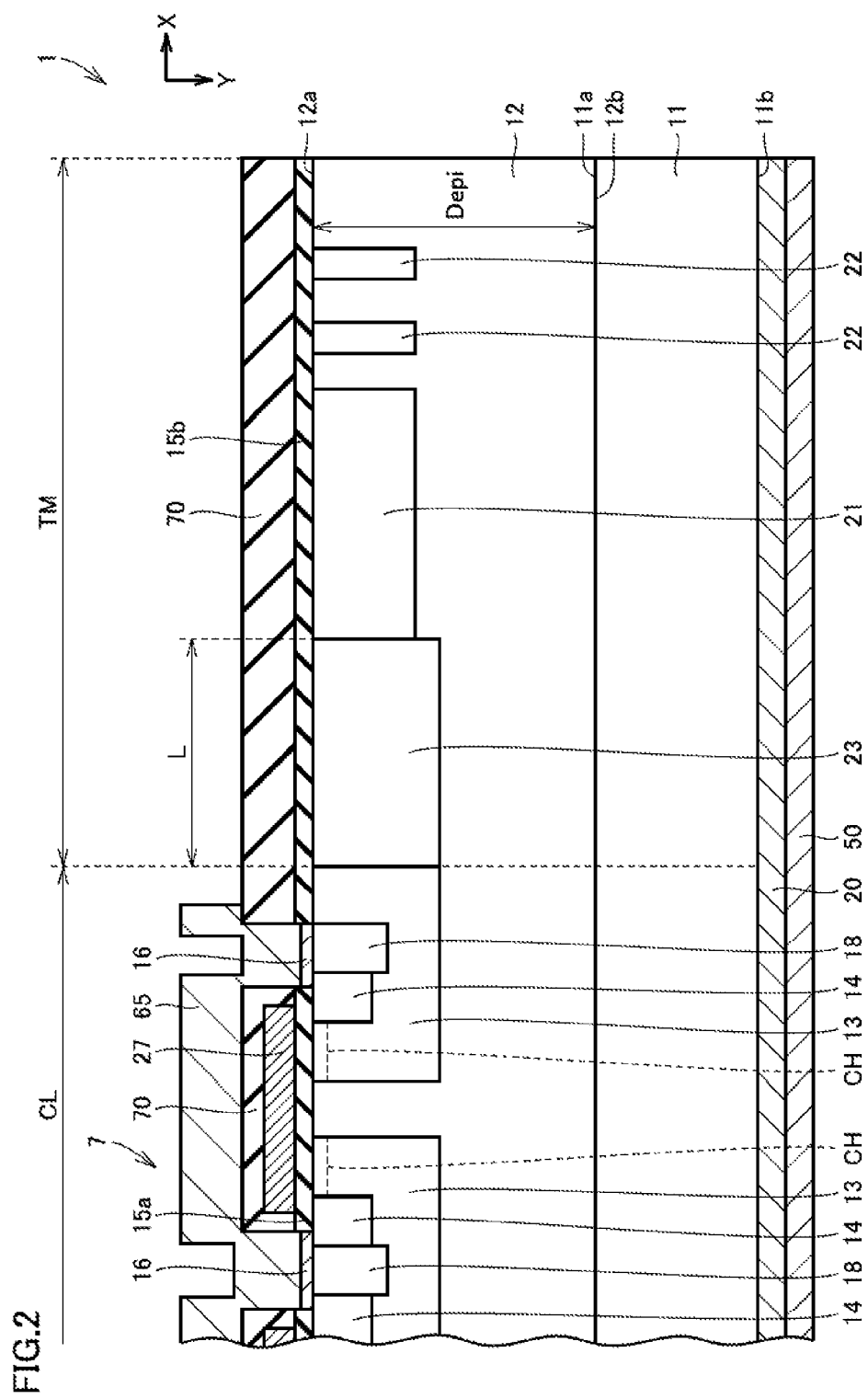
FIG. 2 is a schematic cross-sectional view of silicon carbide semiconductor device 1 according to the first embodiment of the present invention taken along line II-II in FIG. 1.

FIG. 2 is a schematic cross-sectional view of silicon carbide semiconductor device 1 according to the first embodiment of the present invention taken along line II-II in FIG. 1. Referring to FIG. 2, silicon carbide semiconductor device 1 includes a silicon carbide substrate 11, drift layer 12, body regions 13, source regions 14, a gate insulating film 15a, source electrodes 16, contact regions 18, a gate electrode 27, a source pad electrode 65, a drain electrode 20, a backside protection electrode 50, an insulating film 15b, and an interlayer insulating film 70.

Silicon carbide semiconductor device 1 further includes a JTE (Junction Termination Extension) region (first impurity region) 21, guard ring regions 22, and a p type region (second impurity region) 23. While not shown in FIG. 2, termination region TM may have a field stop region disposed on the outer side of guard ring regions 22. This field stop region has an n type conductivity.

Silicon carbide substrate 11 is a semiconductor substrate made of, for example, hexagonal silicon carbide of polytype 4H. Silicon carbide substrate 11 includes a first main surface 11a and a second main surface 11b. Second main surface 11b is located opposite to first main surface 11a. Silicon carbide substrate 11 has an n type conductivity (first conductivity type). Silicon carbide substrate 11 includes an impurity (donor) such as N (nitrogen). Silicon carbide substrate 11 has an impurity concentration of about $1.0\times10^{18}$ cm$^{-3}$, for example.

Drift layer 12 is a silicon carbide layer and is made of, for example, hexagonal silicon carbide of polytype 4H. In one embodiment, drift layer 12 is an n type epitaxial layer.

Drift layer 12 includes first main surface 12a and a second main surface 12b. Second main surface 12b is located opposite to first main surface 12a and in contact with first main surface 11a of silicon carbide substrate 11. In other words, drift layer 12 is disposed on first main surface 11a of silicon carbide substrate 11.

Drift layer 12 includes nitrogen, for example, as an impurity (donor). The impurity concentration in drift layer 12 is lower than the impurity concentration in silicon carbide substrate 11. In one embodiment, drift layer 12 has an impurity concentration of about $1\times10^{14}$ cm$^{-3}$, and drift layer 12 has a thickness Depi of not less than about 10 μm and not more than about 35 μm.

As used herein, the term "below" means a direction from first main surface 12a of drift layer 12 toward second main surface 12b of drift layer 12. In FIG. 2 and the subsequently described figures, a Y direction indicates "below." Further, as used herein, the term "thickness" or "depth" means a length in the Y direction shown in FIG. 2.

Each of body regions 13 is disposed within drift layer 12. In this embodiment, body region 13 is disposed within drift layer 12 so as to be in contact with first main surface 12a of drill layer 12. In one embodiment, body region 13 has a depth of not less than about 0.5 μm and not more than about 1.0 μm from first main surface 12a.

Body region 13 has a p type conductivity (second conductivity type) different from the n type conductivity. Body region 13 includes an impurity (acceptor) such as Al (aluminum) or B (boron). In one embodiment, body region 13 has an impurity concentration of not less than about $5\times10^{17}$ cm$^{-3}$ and not more than about $1\times10^{18}$ cm$^{-3}$.

Body region 13 may have an impurity concentration of not less than about $5\times10^{17}$ cm$^{-3}$ and not more than about $1\times10^{18}$ cm$^{-3}$. If body region 13 has a uniform impurity concentration, the uniform impurity concentration may be not less than about $5\times10^{17}$ cm$^{-3}$ and not more than about $1\times10^{18}$ cm$^{-3}$.

Body region 13 is in contact with p type region 23. Body region 13 is thus electrically connected to p type region 23.

Each of source regions 14 has an n type conductivity. Source region 14 is disposed within body region 13, and in contact with first main surface 12a of drift layer 12 together with body region 13. Source region 14 is separated from drift layer 12 by body region 13.

Source region 14 includes an impurity such as P (phosphorus). The impurity concentration in source region 14 is higher than the impurity concentration in drift layer 12. In one example, source region 14 has an impurity concentration of about $1\times10^{20}$ cm$^{-3}$.

Each of contact regions 18 has a p type conductivity. Contact region 18 is disposed within body region 13. In this embodiment, contact region 18 is in contact with first main surface 12a of drift layer 12 together with body region 13 and source region 14. Contact region 18 includes an impurity such as aluminum or boron. The impurity concentration in contact region 18 is higher than the impurity concentration in body region 13. In one example, contact region 18 has an impurity concentration of about $1\times10^{20}$ cm$^{-3}$.

Gate insulating film 15a covers a surface of at least a channel region CH of body region 13. Channel region CH is a portion of body region 13 which lies between drift layer 12 and source region 14. Gate insulating film 15a is made of silicon dioxide, for example. Gate insulating film 15a has a thickness of about 50 nm, for example.

Gate insulating film 15a is in contact with body regions 13, source regions 14 and drift layer 12 so as to extend from source region 14 formed in one of two adjacent body regions 13 to source region 14 formed in the other body region 13. Accordingly, gate insulating film 15a is disposed on channel regions CH of two adjacent body regions 13.

Gate electrode 27 is disposed in contact with gate insulating film 15a. Accordingly, gate electrode 27 is disposed to face source regions 14 and channel regions CH of two adjacent body regions 13, as well as a portion of drift layer 12 which lies between those two body regions 13. Gate electrode 27 is made of a conductor such as polysilicon including an impurity, or aluminum.

Each of source electrodes 16 is in contact with source region 14 and contact region 18. Source electrode 16 is electrically connected to source region 14 and contact region 18. Preferably, source electrode 16 is made of a material including nickel and silicon. Source electrode 16 may be made of a material including titanium, aluminum and silicon. Preferably, source electrode 16 is in ohmic contact with source region 14 and contact region 18.

JTE region 21 is disposed within drift layer 12. Further, JTE region 21 is in contact with first main surface 12a of drift layer 12. JTE region 21 has a p type conductivity. JTE region 21 includes an impurity (acceptor) such as aluminum or boron. In one embodiment, JTE region 21 has an impurity concentration of not less than about $1 \times 10^{17}$ cm$^{-3}$ and not more than about $5 \times 10^{17}$ cm$^{-3}$.

JTE region 21 is disposed on the outer side of body region 13 and separated from body region 13. The "outer side" refers to the side across body region 13 from gate electrode 27 in a direction along first main surface 12a of drift layer 12. In FIG. 2 and the subsequently described figures, the direction along first main surface 12a of drift layer 12 is represented as an X direction. That is, JTE region 21 is disposed across body region 13 from gate electrode 27 in the X direction. The depth of JTE region 21 may be smaller than the depth of body region 13. Alternatively, the depth of JTE region 21 may be greater than the depth of body region 13.

Guard ring regions 22 are disposed on the outer side of JTE region 21 and surround JTE region 21. Guard ring regions 22 are separated from JTE region 21. In the configuration shown in FIG. 2, guard ring regions 22 are in contact with first main surface 12a of drift layer 12. However, guard ring regions 22 may be separated from first main surface 12a of drift layer 12. In addition, the number of guard ring regions 22 is not particularly limited.

P type region 23 is disposed within drift layer 12 so as to connect body region 13 and JTE region 21 to each other. Specifically, p type region 23 is disposed within drift layer 12 between body region 13 and JTE region 21. The depth of p type region 23 from first main surface 12a is substantially equal to the depth of body region 13 from first main surface 12a, for example.

The boundary between element region CL and termination region TM is not particularly limited. For example, the boundary between element region CL and termination region TM may be defined as the boundary between body region 13 and p type region 23. Alternatively, the boundary between element region CL and termination region TM may be defined as the boundary between p type region 23 and JTE region 21.

Body region 13, JTE region 21 and p type region 23 have the same conductivity type (p type). Accordingly, body region 13 and JTE region 21 are electrically connected to each other through p type region 23. A length L of p type region 23 is the length of p type region 23 along first main surface 12a of drift layer 12. In FIG. 2, length L of p type region 23 corresponds to the length of p type region 23 along the X direction. Length L can be defined as the length from the boundary between p type region 23 and body region 13 to the boundary between p type region 23 and JTE region 21.

P type region 23 includes an impurity (acceptor) such as aluminum or boron. The impurity concentration in p type region 23 is equal to or higher than the impurity concentration in drift layer 12 and equal to or lower than the lower limit of the impurity concentration in body region 13.

The reason that the impurity concentration in p type region 23 is equal to or higher than the impurity concentration in drift layer 12 is as follows. P type region 23 and drift layer 12 have different conductivity types. It is difficult to form a p type region having an impurity concentration lower than that in drift layer 12 within drift layer 12. This why the impurity concentration in p type region 23 is equal to or higher than the impurity concentration in drift layer 12.

On the other hand, the reason that the impurity concentration in p type region 23 is equal to or lower than the lower limit of the impurity concentration in body region 13 is as follows. When avalanche breakdown occurs in JTE region 21, the voltage of JTE region 21 increases. In this case, the voltage of body region 13 depends on a voltage drop that occurs in p type region 23. The higher the resistance value of p type region 23, the larger the voltage drop in p type region 23. The impurity concentration in p type region 23 is equal to or lower than the lower limit of the impurity concentration in body region 13 so as to increase the resistance value of p type region 23. When the impurity concentration in p type region 23 is substantially equal to the impurity concentration in body region 13, the resistance value of p type region 23 can be increased by, for example, increasing length L of p type region 23.

Gate electrode 27 has a low voltage (e.g., between 0 V to 15 V). Thus, the larger the voltage drop is in p type region 23, the further the voltage difference between body region 13 and gate electrode 27 can be reduced. By reducing the voltage difference between body region 13 and gate electrode 27, an electric field applied to gate insulating film 15a can be reduced. Accordingly, the possibility of breakdown of gate insulating film 15a can be reduced.

Preferably, the impurity concentration in p type region 23 is equal to or higher than the impurity concentration in drift layer 12 and lower than the lower limit of the impurity concentration in body region 13. Since the impurity concentration in p type region 23 is lower than the lower limit of the impurity concentration in body region 13, a sufficient voltage drop can be generated in p type region 23. Thus, the electric field applied to gate insulating film 15a can be reduced. Accordingly, the possibility of breakdown of gate insulating film 15a can be further reduced. Further, the impurity concentration in p type region 23 is equal to or lower than the impurity concentration in JTE region 21. Consequently, when avalanche breakdown occurs in JTE region 21, a sufficient voltage drop can be generated in p type region 23.

The impurity concentration in p type region 23 is selected within the range satisfying the conditions above. In one embodiment, p type region 23 has an impurity concentration of not less than about $1 \times 10^{14}$ cm$^{-3}$ and less than about $5 \times 10^{17}$ cm$^{-3}$. By defining the range of the impurity concentration in p type region 23 in this manner, when avalanche breakdown occurs between JTE region 21 and drift layer 12, the electrical resistance value can be set appropriately so as to generate a sufficient voltage drop in p type region 23. Preferably, p type region 23 has an impurity concentration of not less than about $1\times10^{16}$ cm$^{-3}$ and less than about $5\times10^{17}$ cm$^{-3}$. By further raising the lower limit of the impurity concentration in p type region 23, the voltage difference between body region 13 and JTE region 21 can be made small until, for example, avalanche breakdown occurs in JTE region 21. Accordingly, the breakdown voltage of silicon carbide semiconductor device 1 can be increased.

In the embodiment of the present invention, length L of p type region 23 is equal to or greater than ⅓ of thickness Depi of drift layer 12. Consequently, the resistance value of p type region 23 can be increased, and therefore a sufficient voltage drop can be generated in p type region 23. If thickness Depi is about 15 μm as an example, length L can be not less than 5 μm. The upper limit of length L is not particularly limited.

Insulating film 15b is disposed on first main surface 12a of drift layer 12 to cover part of body region 13, p type region 23, JTE region 21, and guard ring regions 22. Insulating film 15b is made of silicon dioxide, for example. Insulating film 15b may have the same thickness as gate insulating film 15a.

Interlayer insulating film 70 is disposed on gate insulating film 15a to cover gate electrode 27. Interlayer insulating film 70 is also disposed on insulating film 15b.

Source pad electrode 65 is in contact with source electrodes 16 and covers interlayer insulating film 70. Source pad electrode 65 is made of aluminum, for example. Source pad electrode 65 and source electrodes 16 may be integrated together.

Drain electrode 20 is disposed in contact with second main surface 11b of silicon carbide substrate 11. Drain electrode 20 is electrically connected to silicon carbide substrate 11, and electrically connected to drift layer 12 through silicon carbide substrate 11. Drain electrode 20 may have a similar configuration to source electrode 16, for example. Alternatively, drain electrode 20 may be made of another material capable of making ohmic contact with silicon carbide substrate 11, such as nickel.

Backside protection electrode 50 is disposed in contact with drain electrode 20. Backside protection electrode 50 is electrically connected to drain electrode 20. Backside protection electrode 50 is made of, for example, titanium, nickel, silver, or an alloy thereof.

Figure 3:
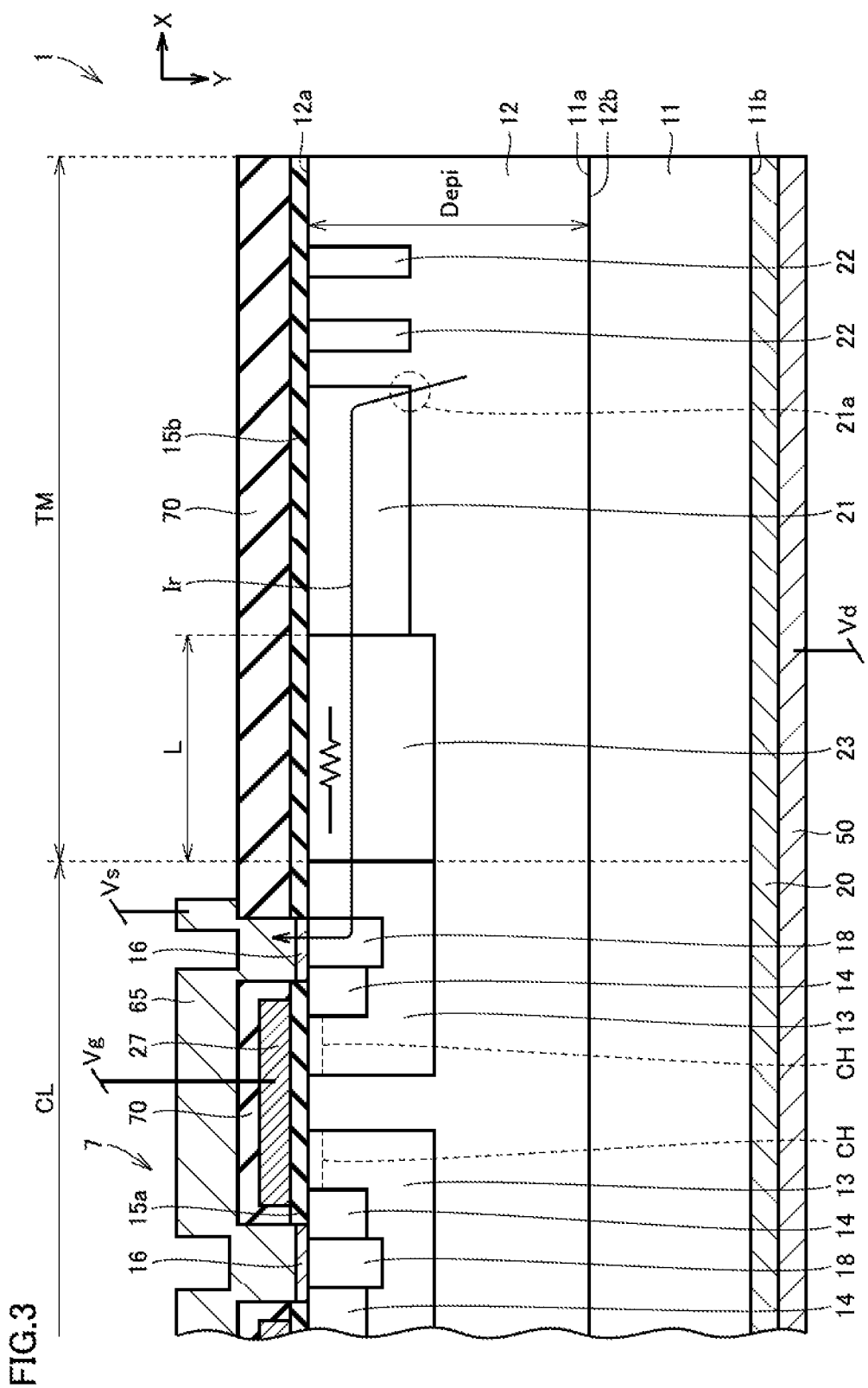
FIG. 3 is a schematic diagram illustrating improvement in ruggedness of silicon carbide semiconductor device 1 according to the first embodiment of the present invention.

FIG. 3 is a schematic diagram illustrating improvement in ruggedness of silicon carbide semiconductor device 1 according to the first embodiment of the present invention. Referring to FIG. 3, a drain voltage Vd is applied through backside protection electrode 50 and drain electrode 20 to silicon carbide substrate 11 and drift layer 12. A gate voltage Vg is applied to gate electrode 27. A source voltage Vs is applied through source pad electrode 65 and source electrode 16 to source region 14 and contact region 18. Source voltage Vs is applied through contact region 18 to body region 13.

Gate insulating film 15a lies between body region 13 and gate electrode 27. A voltage applied to gate insulating film 15a corresponds to a difference between gate voltage Vg and source voltage Vs. This voltage is controlled such that it does not exceed a withstand voltage of gate insulating film 15a.

In this embodiment, silicon carbide semiconductor device 1 is an n channel MOSFET. When silicon carbide semiconductor device 1 is used, drain voltage Vd will be high as compared to source voltage Vs. Accordingly, drain voltage Vd will be high as compared to source voltage Vs when silicon carbide semiconductor device 1 is used at high voltage.

Body region 13, p type region 23 and JTE region 21 are electrically connected to one another. Thus, the voltages of body region 13, p type region 23 and JTE region 21 are low as compared to drain voltage Vd. Consequently, a depletion layer (not shown) extends from a junction surface between drift layer 12 and body region 13, a junction surface between drift layer 12 and p type region 23, and a junction surface between drift layer 12 and JTE region 21.

However, electric field concentration tends to occur in a portion where the depletion layer does not extend well. Since JTE region 21 has the highest impurity concentration out of body region 13, p type region 23 and JTE region 21, electric field concentration may occur in JTE region 21. For example, an electric field tends to be concentrated in an end portion 21a of JTE region 21 due to a large curvature of the junction surface. Avalanche breakdown may consequently occur in end portion 21a of JTE region 21.

Since drain voltage Vd is higher than source voltage Vs, the occurrence of avalanche breakdown in JTE region 21 causes a reverse current Ir to flow from drift layer 12 toward JTE region 21. Reverse current Ir flows from JTE region 21 through p type region 23 to body region 13, then through contact region 18 and source electrode 16 to source pad electrode 65.

A voltage drop in p type region 23 is determined by the product of a value of reverse current Ir and the resistance value of p type region 23. By increasing the resistance value of p type region 23, the voltage drop in p type region 23 can be increased. The increased voltage drop in p type region 23 can reduce an amount of increase in voltage of body region 13 (source voltage Vs). As a result, the difference between gate voltage Vg and source voltage Vs can be suppressed to a level equal to or less than the withstand voltage of gate insulating film 15a. Accordingly, the possibility of damage to gate insulating film 15a can be reduced.

Further, p type region 23 can function as a current limit resistor due to its high resistance value. When avalanche breakdown occurs in JTE region 21, p type region 23 can limit a current flowing through body region 13. As a result, the current density in body region 13 can be reduced when avalanche breakdown occurs. Accordingly, the MOSFET cells can be protected more effectively when a high voltage is applied to silicon carbide semiconductor device 1.

Moreover, p type region 23 is separated from contact region 18. That is, part of body region 13 lies between p type region 23 and contact region 18. Consequently, a voltage drop can be generated in body region 13 in addition to the voltage drop in p type region 23. Accordingly, the MOSFET cells can be protected more effectively.

P type region 23 is located across source region 14 from channel region CH. Accordingly, the effect of the impurity concentration in p type region 23 on the on-resistance of the MOSFET cells is small. Further, since a static breakdown voltage of silicon carbide semiconductor device 1 can be determined by JTE region 21, the effect of the impurity concentration in p type region 23 on the static breakdown voltage of silicon carbide semiconductor device 1 can also be reduced.

Figure 4:
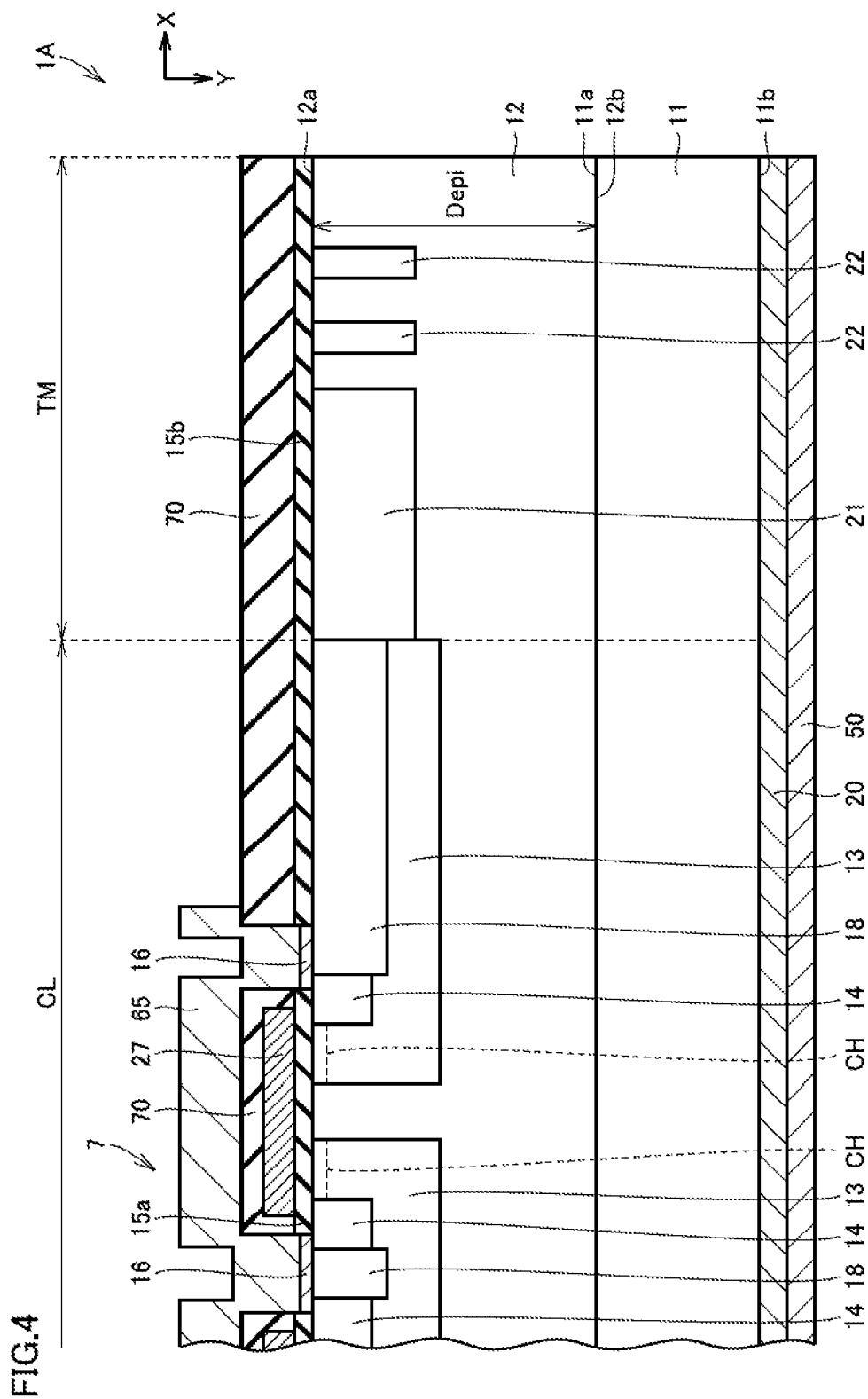
FIG. 4 is a cross-sectional view showing one structural example of a silicon carbide semiconductor device.
Figure 5:
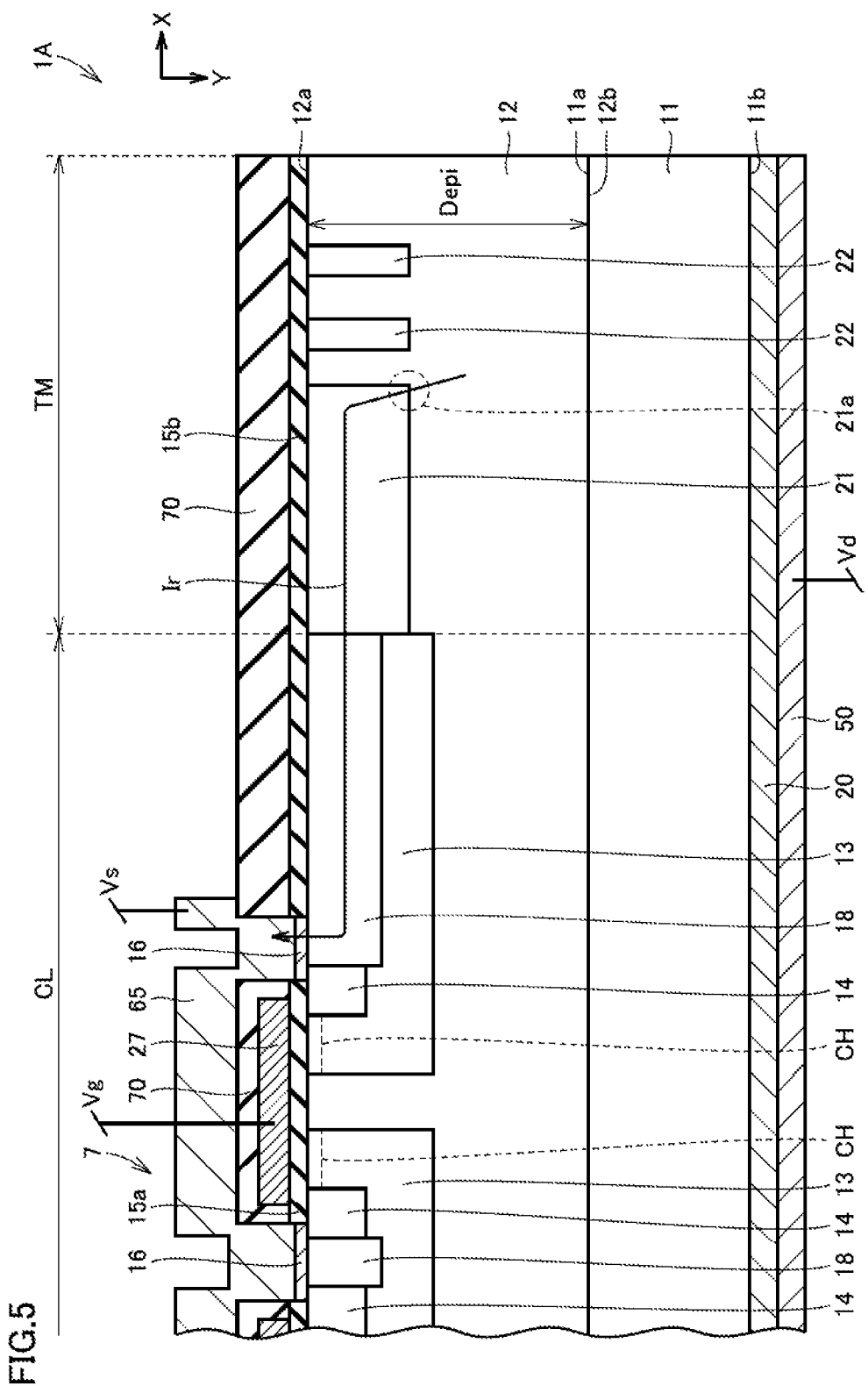
FIG. 5 is a diagram illustrating a problem of the silicon carbide semiconductor device shown in FIG. 4.

FIGS. 4 and 5 are provided to better clarify the advantages of silicon carbide semiconductor device 1 according to the first embodiment of the present invention. FIG. 4 is a cross-sectional view showing one structural example of a silicon carbide semiconductor device. FIG. 5 is a diagram illustrating a problem of the silicon carbide semiconductor device shown in FIG. 4.

Referring to FIGS. 4 and 5, a silicon carbide semiconductor device 1A includes body region 13 and contact region 18 each connected to JTE region 21. Thus, p type region 23 is omitted from silicon carbide semiconductor device 1A. Silicon carbide semiconductor device 1A is different from silicon carbide semiconductor device 1 according to the first embodiment of the present invention in this respect. The other components of silicon carbide semiconductor device 1A are configured similarly to the corresponding components of silicon carbide semiconductor device 1, and thus description thereof will not be repeated.

The length of body region 13 in the X direction in silicon carbide semiconductor device 1A is equal to the sum of the length of body region 13 in the X direction and length L of p type region 23 in the X direction in silicon carbide semiconductor device 1. Silicon carbide semiconductor device 1 and silicon carbide semiconductor device 1A are identical to each other in impurity concentration in body region 13, impurity concentration in JTE region 21, and impurity concentration in contact region 18.

Contact region 18 has a high impurity concentration (e.g., $1 \times 10^{18}$ cm$^{-3}$) as compared to body region 13. In other words, contact region 18 has a small resistance value. Accordingly, source voltage Vs can be provided through contact region 18 to JTE region 21. Moreover, the voltage of JTE region 21 can be reliably fixed.

Referring to FIG. 5, it is assumed that avalanche breakdown has occurred in end portion 21a of JTE region 21. A voltage drop in contact region 18 is small due to the small resistance value of contact region 18. Consequently, a high voltage is applied to body region 13, which leads to an increased possibility of damage to gate insulating film 15a in the MOSFET cell.

Further, if drain voltage Vd varies rapidly due to switching, a temporal variation in drain voltage Vd (dV/dt) becomes steeper. The variation in drain voltage Vd may cause a transient current to flow through JTE region 21. According to the first embodiment, the possibility of damage to the silicon carbide semiconductor device by the transient current can be reduced.

As described above, according to the first embodiment, the ruggedness of the silicon carbide semiconductor device can be improved by p type region 23. Specifically, results of comparison between silicon carbide semiconductor device 1 according to the first embodiment of the present invention and silicon carbide semiconductor device 1A shown in FIG. 4 are shown with respect to (1) avalanche resistance and (2) dV/dt resistance.

(1) Avalanche Resistance

The avalanche resistance indicates an amount of energy at which a semiconductor device can resist breakdown when avalanche breakdown occurs. A unit of the avalanche resistance (mJ/cm$^2$) indicates destructive energy per active area of a semiconductor device.

The avalanche resistance was measured under certain conditions. Silicon carbide semiconductor device 1A shown in FIG. 4 had an avalanche resistance of 500 mJ/cm$^2$. On the other hand, silicon carbide semiconductor device 1 according to the first embodiment of the present invention had an avalanche resistance of 3000 mJ/cm$^2$ under the same conditions.

(2) dV/dt Resistance

The dV/dt resistance indicates a temporal variation in voltage that can be withstood by an element. Both silicon carbide semiconductor device 1 according to the first embodiment of the present invention and silicon carbide semiconductor device 1A shown in FIG. 4 had a dV/dt resistance of not less than 30 kV/usec. It can be appreciated from these results that the avalanche resistance can be improved without a reduction in dV/dt resistance according to the first embodiment of the present invention.

(3) Effect of Length L of P Type Region 23

The greater the length L of p type region 23, the higher the resistance value of p type region 23. The avalanche resistance can be improved by increasing the resistance value of p type region 23. As described above, it is preferable that length L of p type region 23 be equal to or greater than ⅓ of thickness Depi of drift layer 12.

The effect of length L of p type region 23 was evaluated using two samples having different lengths L of p type region 23.

1. Conditions of Samples

Sample 1:
Impurity concentration in body region 13: $2 \times 10^{17}$/cm$^{-3}$
Impurity concentration in p type region 23: $9 \times 10^{16}$/cm$^{-3}$
Impurity concentration in JTE region 21: $1 \times 10^{17}$/cm$^{-3}$
Thickness Depi of drift layer 12: 15 μm
Length L of p type region 23: 5 μm (L≥Depi×⅓)

Sample 2:
Impurity concentration in body region 13: $2 \times 10^{17}$/cm$^{-3}$
Impurity concentration in p type region 23: $9 \times 10^{16}$/cm$^{-3}$
Impurity concentration in JTE region 21: $1 \times 10^{17}$/cm$^{-3}$
Thickness Depi of drift layer 12: 15 μm
Length L of p type region 23: 2 μm (L<Depi×⅓)

2. Method of Evaluating Samples

A reverse bias voltage (e.g., 1800 V) equal to or higher than the specifications was applied to a silicon carbide semiconductor device to generate avalanche breakdown within the device. Then, a leak current between a gate and a source was measured.

3. Results of Evaluation

A leak failure was suppressed in sample 1, whereas the leak current increased in sample 2. It was confirmed from the evaluation of samples 1 and 2 that the effect of suppressing the leak between the gate and source could be provided because of L≥Depi×⅓.

As described above, according to the first embodiment of the present invention, the silicon carbide semiconductor device having improved ruggedness can be provided.

Second Embodiment

A schematic plan view of a silicon carbide semiconductor device 2 according to a second embodiment of the present invention is similar to the plan view of FIG. 1. That is, regarding the arrangement of element region CL and termination region TM, silicon carbide semiconductor device 2 according to the second embodiment has the same configuration as silicon carbide semiconductor device 1 according to the first embodiment.

Figure 6:
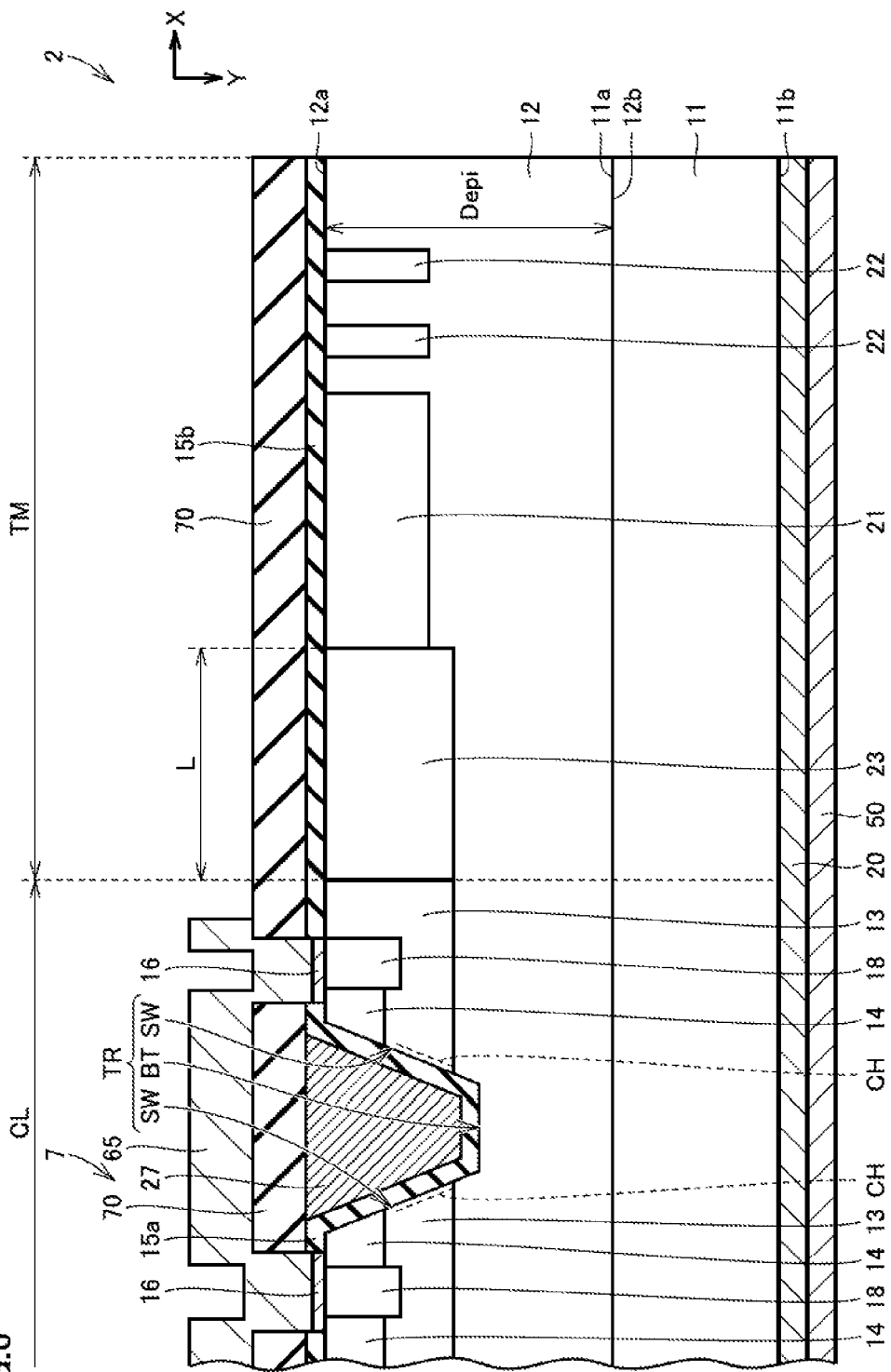
FIG. 6 is a schematic cross-sectional view of a silicon carbide semiconductor device 2 according to a second embodiment of the present invention.

FIG. 6 is a schematic cross-sectional view of silicon carbide semiconductor device 2 according to the second embodiment of the present invention. Referring to FIGS. 2 and 6, silicon carbide semiconductor device 2 is different from silicon carbide semiconductor device 1 in that a trench TR is formed in first main surface 12a of drift layer 12.

Trench TR includes side portions SW and a bottom BT. Side portions SW extend from first main surface 12a of drift layer 12 through source regions 14 and body regions 13 to reach the inside of drift layer 12. In other words, the junction surfaces between body regions 13 and drift layer 12 cross side portions SW.

Side portions SW are covered with gate insulating film 15a. Channel regions CH are formed in portions of body regions 13 which are in contact with gate insulating film 15a (portions of body regions 13 which lie between source regions 14 and drift layer 12).

Side portions SW are surfaces inclined with respect to first main surface 12a of drift layer 12 so as to extend toward second main surface 12b of drift layer 12. Opposed two side portions SW are tapered to expand toward first main surface 12a of drift layer 12.

Each of side portions SW has a predetermined crystal plane (also referred to as a special plane) at a portion over body region 13. The "special plane" is a plane including a first plane having a plane orientation of {0-33-8}. More preferably, the special plane microscopically includes the first plane, and further microscopically includes a second plane having a plane orientation of {0-11-1}. More preferably, the first plane and the second plane include a combined plane having a plane orientation of {0-11-2}. The special plane can also be defined as a plane macroscopically having an off angle of 62°±10° relative to the {000-1} plane. The term "macroscopically" means disregarding a fine structure having a size of approximately interatomic spacing. For the measurement of such a macroscopic off angle, a method employing general X-ray diffraction can be used, for example.

As shown in FIG. 6, silicon carbide semiconductor device 2 according to the second embodiment of the present invention includes cells of a trench gate MOSFET. A trench gate MOSFET is advantageous over a planar gate MOSFET in terms of improvement in density of cells. According to the second embodiment of the present invention, therefore, the density of MOSFET cells can be increased.

Further, trench TR includes side portions SW according to the above definition. Consequently, the channel resistance of the MOSFET cells made of a silicon carbide semiconductor can be reduced. According to the second embodiment of the present invention, therefore, the silicon carbide semiconductor device having high ruggedness and low on-resistance can be realized.

Bottom BT is located within drift layer 12. For example, bottom BT has a flat shape substantially parallel to first main surface 12a of drift layer 12. Bottom BT is covered with gate insulating film 15a.

Bottom BT may be omitted from trench TR. In other words, trench TR may be V-shaped in cross section. Such a configuration can reduce the diameter of the opening of trench TR. Accordingly, the density of MOSFET cells can be further increased.

Side portions SW are not limited to be inclined with respect to first main surface 12a of drift layer 12. For example, side portions SW may be substantially perpendicular to first main surface 12a of drift layer 12. Such a shape can further reduce the diameter of the opening of trench TR. Accordingly, the density of MOSFET cells can be further increased.

Third Embodiment

Figure 7:
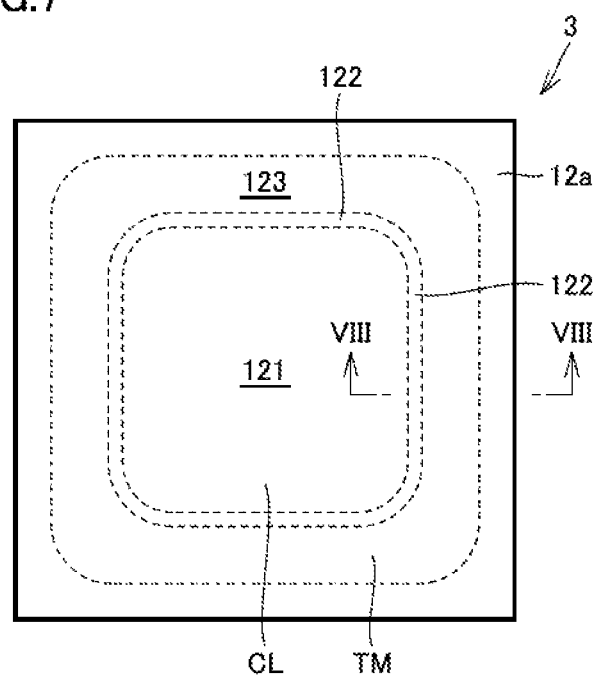
FIG. 7 is a schematic plan view of a silicon carbide semiconductor device 3 according to a third embodiment of the present invention.
Figure 8:
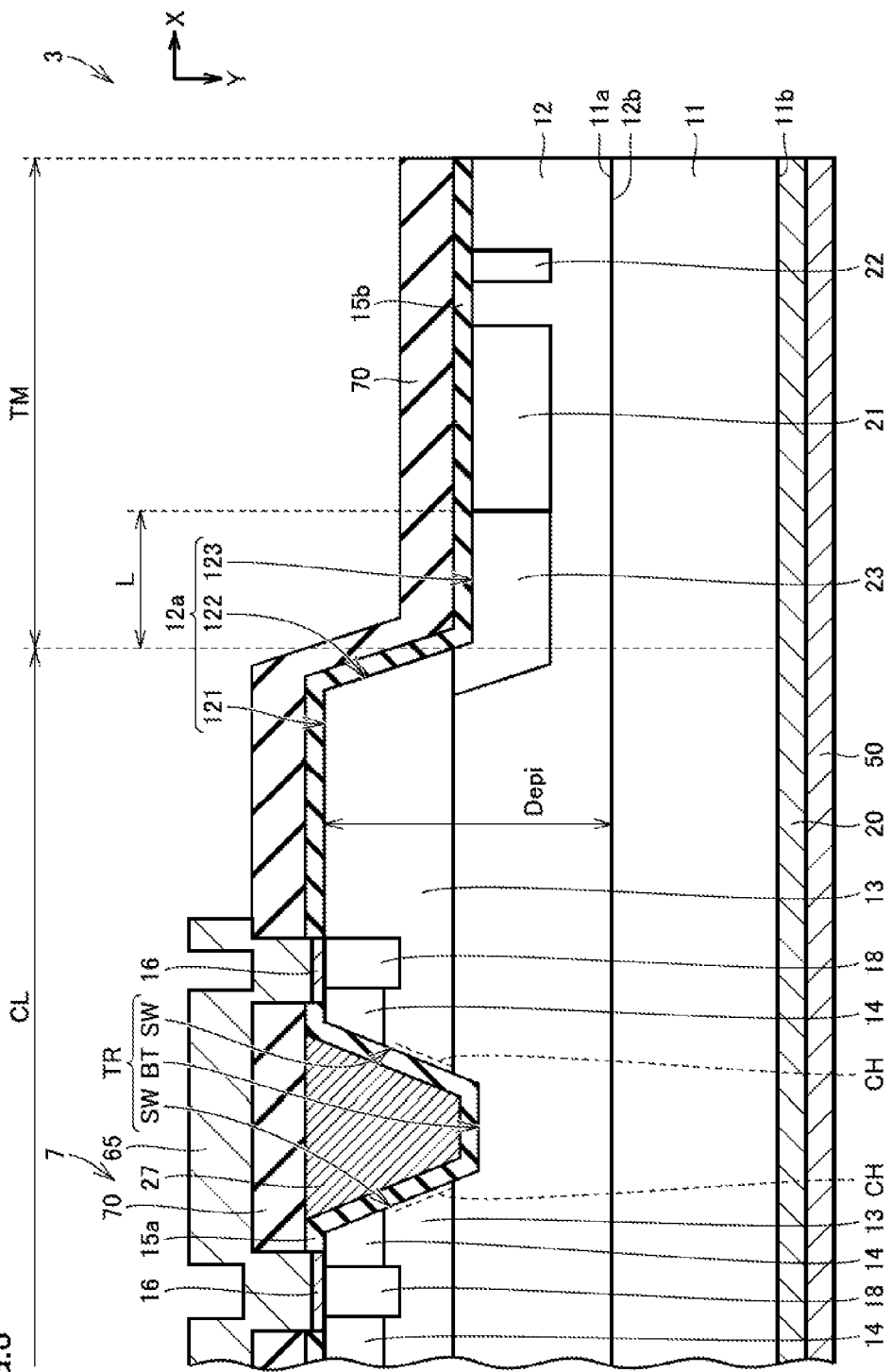
FIG. 8 is a schematic cross-sectional view of silicon carbide semiconductor device 3 according to the third embodiment of the present invention taken along line VIII-VIII in FIG. 7.

FIG. 7 is a schematic plan view of a silicon carbide semiconductor device 3 according to a third embodiment of the present invention. FIG. 8 is a schematic cross-sectional view of silicon carbide semiconductor device 3 according to the third embodiment of the present invention taken along line VIII-VIII in FIG. 7. Referring to FIGS. 7 and 8, silicon carbide semiconductor device 3 is different from silicon carbide semiconductor device 2 according to the second embodiment (see FIG. 6) in the configuration of region TM. Specifically, first main surface 12a of drift layer 12 includes a flat surface (first surface) 121, a sidewall surface (second surface) 122, and a bottom surface (third surface) 123.

Flat surface 121 is located in element region CL. Sidewall surface 122 and bottom surface 123 are located in termination region TM. Sidewall surface 122 surrounds flat surface 121, and is inclined with respect to flat surface 121 so as to extend toward second main surface 12b of drift layer 12. Bottom surface 123 surrounds sidewall surface 122 in termination region TM.

The inclination of bottom surface 123 with respect to flat surface 121 is smaller than the inclination of sidewall surface 122 with respect to flat surface 121. The "smaller inclination" is a concept including no inclination, that is, parallel. Bottom surface 123 may thus be substantially parallel to flat surface 121. In one embodiment, sidewall surface 122 is a surface having the same inclination angle as side portions SW of trench TR, and bottom surface 123 is a surface having the same inclination angle as bottom BT of trench TR.

Source region 14 and contact region 18 are in contact with flat surface 121. Body region 13 is in contact with flat surface 121 and sidewall surface 122. JTE region 21 is in contact with bottom surface 123. P type region 23 is disposed within drift layer 12 and below body region 13 to connect body region 13 and JTE region 21 to each other. In the configuration shown in FIG. 8, p type region 23 is disposed below sidewall surface 122 and bottom surface 123. Guard ring region 22 is disposed within drift layer 12 and below bottom surface 123.

Length L of p type region 23 can be defined as the length of a portion of p type region 23 below bottom surface 123 in the X direction. Thickness Depi of drift layer 12 can be defined as the thickness of drift layer 12 from flat surface 121 to second main surface 12b of drift layer 12. That is, thickness Depi of drift layer 12 may be a maximum value of the thickness of drift layer 12 in silicon carbide semiconductor device 3. In the configuration shown in FIG. 8, p type region 23 is in contact with sidewall surface 122 and bottom surface 123. P type region 23, however, is not limited to be in contact with a certain surface as long as it connects body region 13 and JTE region 21 to each other.

As in the first and second embodiments, length L of p type region 23 is equal to or greater than ⅓ of thickness Depi of drift layer 12. By defining length L of p type region 23 in this manner, p type region 23 can have a sufficiently high resistance value. According, to the third embodiment, therefore, the silicon carbide semiconductor device having high ruggedness can be realized as in the first and second embodiments.

Further, JTE region 21 and guard ring region 22 are provided below bottom surface 123. Consequently, electric field concentration can be relaxed, thereby increasing the breakdown voltage of silicon carbide semiconductor device 3.

In the configuration shown in FIG. 8, the MOSFET cells have the same configuration as the MOSFET cells of silicon carbide semiconductor device 2 according to the second embodiment. The third embodiment is not limited as such, however. The MOSFET cells shown in FIG. 8 may be replaced by the MOSFET cells of silicon carbide semiconductor device 1 according to the first embodiment (see FIG. 2). That is, the MOSFET cells may be cells of a planar MOSFET in the silicon carbide semiconductor device according to the third embodiment.

In the embodiments described above, a MOSFET has been illustrated as an example of a silicon carbide semiconductor device. The silicon carbide semiconductor device according to the embodiment of the present invention, however, can be applied to a silicon carbide semiconductor device including a gate insulating film and a gate electrode. Accordingly, the silicon carbide semiconductor device according to the embodiment of the present invention may be a MISFET (Metal Insulator Semiconductor Field Effect Transistor)

other than the MOSFET, or a silicon carbide semiconductor device other than the MISFET. Examples of a silicon carbide semiconductor device other than the MISFET include an IGBT (Insulated Gate Bipolar Transistor).

Figure 9:
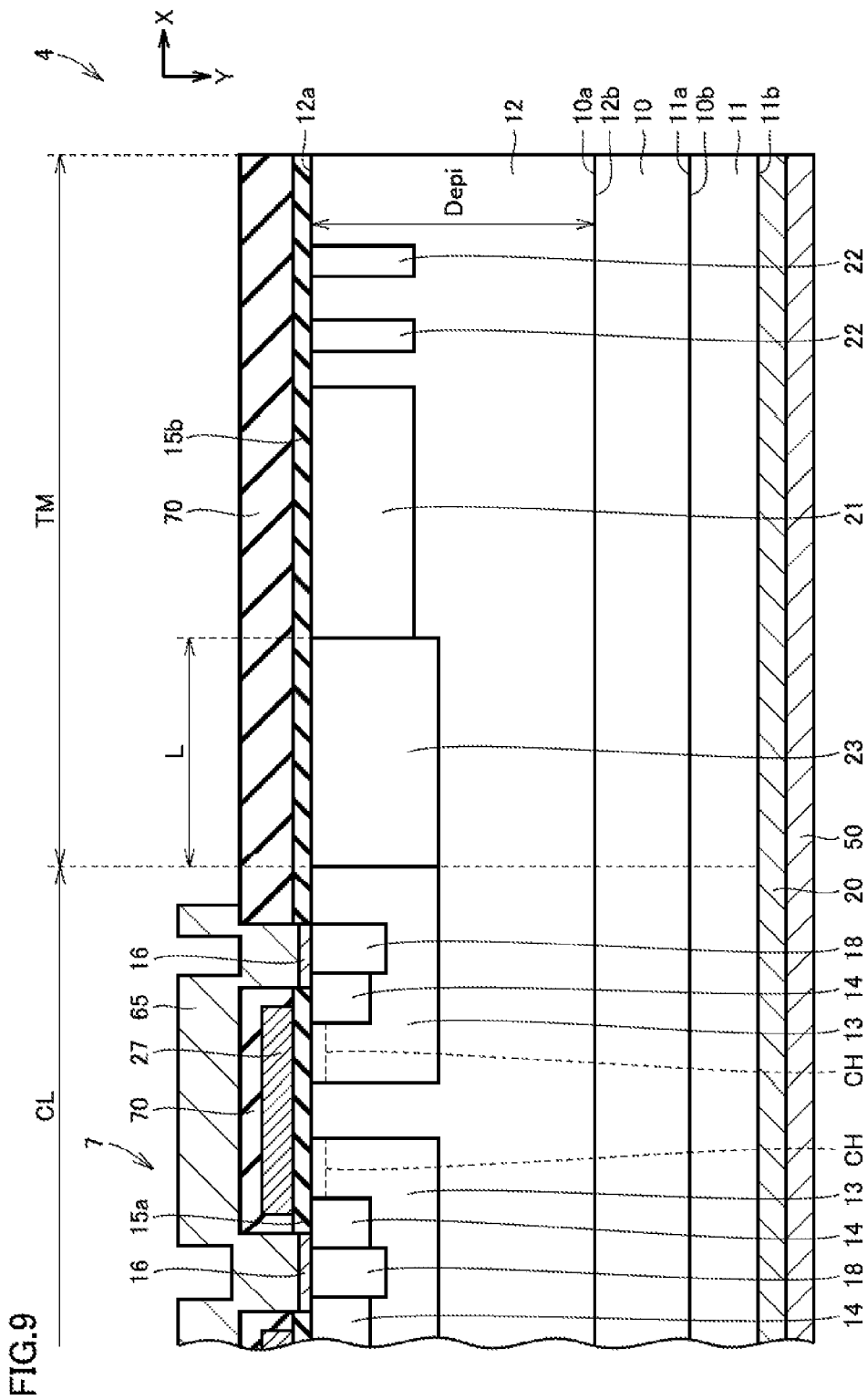
FIG. 9 is a cross-sectional view showing a structural example of an IGBT realized by the silicon carbide semiconductor device according to the embodiment of the present invention.

FIG. 9 is a cross-sectional view showing a structural example of an IGBT realized by the silicon carbide semiconductor device according to the embodiment of the present invention. Referring to FIGS. 2 and 9, a silicon carbide semiconductor device 4 (IGBT) according to the embodiment of the present invention is different from silicon carbide semiconductor device 1 (MOSFET) in that silicon carbide substrate 11 has a p type conductivity. An n type silicon carbide layer 10 is disposed on first main surface 11a of silicon carbide substrate 11.

Silicon carbide layer 10 includes a first main surface 10a and a second main surface 10b. First main surface 10a is in contact with second main surface 12b of drift layer 12. Second main surface 10b is located opposite to first main surface 10a and in contact with first main surface 11a of silicon carbide substrate 11.

The impurity concentration in silicon carbide layer 10 is higher than the impurity concentration in drift layer 12. Silicon carbide layer 10 is an epitaxial layer, for example. In this case, too, thickness Depi of drift layer 12 and length L of p type region 23 are determined so as to satisfy L≥Depi×⅓.

Further, in the embodiments described above, the silicon carbide layer has an n type conductivity (first conductivity type), while body region 13, JTE region 21 and p type region 23 have a p type conductivity (second conductivity type). By forming the p type regions in the n type silicon carbide layer, the manufacturability of the silicon carbide semiconductor device can be improved. However, the first conductivity type may be p type and the second conductivity type may be n type.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide semiconductor device comprising:
   a silicon carbide layer including a first main surface and a second main surface located opposite to said first main surface, said silicon carbide layer having a first conductivity type;
   a body region disposed within said silicon carbide layer, said body region having a second conductivity type different from said first conductivity type;
   a source region disposed within said body region so as to be in contact with said first main surface of said silicon carbide layer, said source region having said first conductivity type;
   a gate insulating film disposed so as to cover a surface of at least a portion of said body region which lies between said source region and said silicon carbide layer;
   a gate electrode in contact with said gate insulating film;
   a source electrode disposed so as to be electrically connected to said body region and said source region;
   a first impurity region disposed within said silicon carbide layer and away from said body region, across said body region from said gate electrode in a direction along said first main surface of said silicon carbide layer, said first impurity region having said second conductivity type; and
   a second impurity region disposed within said silicon carbide layer so as to connect said body region and said first impurity region to each other, said second impurity region having said second conductivity type,
   an impurity concentration in said second impurity region being equal to or higher than an impurity concentration in said silicon carbide layer and equal to or lower than a lower limit of an impurity concentration in said body region.

2. The silicon carbide semiconductor device according to claim 1, wherein
   the impurity concentration in said second impurity region is lower than the lower limit of the impurity concentration in said body region.

3. The silicon carbide semiconductor device according to claim 1, wherein
   the impurity concentration in said second impurity region is not less than $1\times10^{14}$ cm$^{-3}$ and less than $5\times10^{17}$ cm$^{-3}$.

4. The silicon carbide semiconductor device according to claim 3, wherein
   the impurity concentration in said second impurity region is not less than $1\times10^{16}$ cm$^{-3}$ and less than $5\times10^{17}$ cm$^{-3}$.

5. The silicon carbide semiconductor device according to claim 1, wherein
   the length of said second impurity region along said first main surface of said silicon carbide layer from said body region to said first impurity region is equal to or greater than ⅓ of the thickness of said silicon carbide layer.

6. The silicon carbide semiconductor device according to claim 1, wherein
   said first main surface of said silicon carbide layer is provided with a trench, said trench including a side portion extending through said source region and said body region to reach said silicon carbide layer,
   said gate insulating film is in contact with said side portion of said trench, and
   said gate electrode is in contact with said gate insulating film within said trench.

7. The silicon carbide semiconductor device according to claim 1, wherein
   said first main surface of said silicon carbide layer includes
   a first surface in contact with said source region,
   a second surface connected to said first surface and inclined with respect to said first surface so as to extend toward said second main surface of said silicon carbide layer, and
   a third surface connected to said second surface and being in contact with said first impurity region.

8. The silicon carbide semiconductor device according to claim 1, wherein
   said first conductivity type is n type, and
   said second conductivity type is p type.

* * * * *